US011968497B2

United States Patent
Shi et al.

(10) Patent No.: US 11,968,497 B2
(45) Date of Patent: Apr. 23, 2024

(54) MEMS CHIP

(71) Applicant: AAC ACOUSTIC TECHNOLOGIES (SHENZHEN) CO., LTD., Shenzhen (CN)

(72) Inventors: Zhengyu Shi, Shenzhen (CN); Linlin Wang, Shenzhen (CN); Rui Zhang, Shenzhen (CN)

(73) Assignee: AAC ACOUSTIC TECHNOLOGIES (SHENZHEN) CO., LTD., Shenzhen (CN)

( * ) Notice: Subject to any disclaimer, the term of this patent is extended or adjusted under 35 U.S.C. 154(b) by 101 days.

(21) Appl. No.: 17/739,203

(22) Filed: May 9, 2022

(65) Prior Publication Data

US 2023/0199409 A1    Jun. 22, 2023

(30) Foreign Application Priority Data

Dec. 20, 2021   (CN) .......................... 202123219721.6

(51) Int. Cl.
*H04R 19/04* (2006.01)
*B81B 3/00* (2006.01)
(Continued)

(52) U.S. Cl.
CPC ............. *H04R 19/04* (2013.01); *B81B 3/007* (2013.01); *H04R 7/04* (2013.01); *H04R 7/18* (2013.01);
(Continued)

(58) Field of Classification Search
CPC . H04R 19/04; H04R 7/04; H04R 7/18; H04R 2201/003; H04R 7/20; H04R 2207/021; H04R 19/005; H04R 31/006; H04R 31/003; H04R 31/00; H04R 19/016; H04R 23/006; B81B 3/007; B81B 2201/0257; B81B 2203/0127; B81B 3/0072; B81B 3/0094; B81B 7/0061; B81B 2203/04; B81B 2207/07; B81B 3/001; B81B 3/0051; B81B 2207/015; B81C 1/00166; B81C 2203/0714; H01L 2224/48091; H01L 2224/48137;
(Continued)

(56) References Cited

U.S. PATENT DOCUMENTS 9,319,798 B2 *  4/2016  Okugawa ............. H04R 19/005
9,462,389 B2 * 10/2016  Wang ....................... H04R 7/16
(Continued)

*Primary Examiner* — Angelica M McKinney
(74) *Attorney, Agent, or Firm* — W&G Law Group

(57) ABSTRACT

The present invention discloses a Micro-Electro-Mechanical System MEMS) chip including a substrate with a back cavity; a capacitance system disposed on the substrate including a back plate, a membrane opposite to the back plate forming an inner cavity; a protruding portion accommodated in the inner cavity, fixed on one of the back plate and the membrane and spaced apart from the other along a vibration direction; a reinforce portion fixed to the membrane, having an area smaller than that of the membrane; a support system configured to support the capacitance system, including a first fixation portion suspending the membrane on the substrate, and a second fixation portion suspending the back plate on the substrate. The MEMS chip has higher sensitivity, higher resonance frequency and higher low frequency property.

8 Claims, 4 Drawing Sheets

(51) Int. Cl.
  *H04R 7/04* (2006.01)
  *H04R 7/18* (2006.01)
(52) U.S. Cl.
  CPC ........... *B81B 2201/0257* (2013.01); *B81B 2203/0127* (2013.01); *H04R 2201/003* (2013.01)
(58) Field of Classification Search
  CPC . H01L 2924/15151; H01L 2924/16152; G01L 11/04; G01L 9/0072
  See application file for complete search history.

(56) References Cited

U.S. PATENT DOCUMENTS

| | | | |
|---|---|---|---|
| 9,888,324 B2* | 2/2018 | Hu | H04R 19/04 |
| 10,343,898 B1* | 7/2019 | Chen | H04R 7/08 |
| 2010/0158279 A1* | 6/2010 | Conti | H04R 19/005 381/174 |
| 2012/0319174 A1* | 12/2012 | Wang | H04R 19/005 257/254 |
| 2014/0109680 A1* | 4/2014 | Tsai | G01L 9/0072 73/702 |
| 2015/0078592 A1* | 3/2015 | Uchida | H04R 19/04 381/191 |
| 2015/0110309 A1* | 4/2015 | Park | B81B 3/0086 381/190 |
| 2017/0055085 A1* | 2/2017 | Wang | H04R 19/04 |
| 2017/0180864 A1* | 6/2017 | Zhang | B81B 3/0078 |
| 2018/0115834 A1* | 4/2018 | Yoo | H04R 19/04 |
| 2019/0082269 A1* | 3/2019 | Sun | H04R 19/04 |
| 2023/0164495 A1* | 5/2023 | Zhao | H04R 19/04 381/174 |

* cited by examiner

MEMS CHIP

FIELD OF THE PRESENT INVENTION

The present invention relates to micro-electromechanical systems, especially relates to a MEMS chip applied in mobile device.

DESCRIPTION OF RELATED ART

Micro-Electro-Mechanical System (MEMS) chips are widely applied in acoustic components, such as MEMS condenser microphone. In related art, the MEMS chip is sealed in a shell with an accommodation space. The MEMS chip includes a substrate with a back cavity and a capacitance system disposed on the substrate. The capacitance system includes a membrane and a back plate arranged at an interval. A sound hole is provided on the shell communicating the back cavity, thus allowing the membrane to move under external pressure wave.

In related art, when whole edge of the membrane is fixed on the substrate, the internal stress of the membrane results in a tense state, thus improving the stiffness of the membrane. Under this condition, the sensitivity of the MEMS chip would reduce with the increase of the membrane stiffness. When the edge of the membrane is partially fixed on the substrate, a leakage path formed between the substrate and the membrane may reduce the resonance frequency and the low frequency property of the MEMS chip.

Therefore, it is necessary to provide an improved MEMS chip to overcome the problems mentioned above.

SUMMARY OF THE INVENTION

The main purpose of the present invention is to provide a MEMS chip with higher sensitivity, higher resonance frequency and higher low frequency property.

To achieve the object mentioned above, the present invention provides a MEMS chip includes a substrate with a back cavity; a capacitance system disposed on the substrate, including: a back plate; a membrane opposite to the back plate forming an inner cavity; a protruding portion accommodated in the inner cavity, fixed on one of the back plate and the membrane and spaced apart from the other along a vibration direction; and a reinforce portion fixed to the membrane, having an area smaller than that of the membrane; a support system configured to support the capacitance system, including: a first fixation portion suspending the membrane on the substrate; and a second fixation portion suspending the back plate on the substrate.

Further, a projection of the reinforce portion along the vibration direction is located in the back cavity.

Further, the reinforce portion is fixed to one side of the membrane away from the inner cavity.

Further, the reinforce portion comprises a plurality of reinforce ribs in a strip shape; the reinforce ribs are arranged at intervals.

Further, the membrane is in a circle shape, the reinforce rib extends along a radial direction of the membrane; the reinforce ribs are arranged as a ring around a center of the membrane.

Further, the protruding portion comprises a first protrusion located in a central position and a second protrusion surrounding the first protrusion; along the vibration direction, the first protrusion is located corresponding to the center of the membrane.

Further, the first protrusion is in a cylinder shape.

Further, the second protrusion is in an annular shape.

Further, the protruding portion extends from a side of the back plate facing the membrane towards the membrane.

Further, the capacitance system further comprises a plurality of elastic arms connecting a periphery of the membrane to the first fixation portion.

BRIEF DESCRIPTION OF THE DRAWINGS

The present invention will hereinafter be described in detail with reference to an exemplary embodiment. To make the technical problems to be solved, technical solutions and beneficial effects of present invention more apparent, the present invention is described in further detail together with the figures and the embodiment. It should be understood the specific embodiment described hereby is only to explain this disclosure, not intended to limit this disclosure.

DETAILED DESCRIPTION OF THE EXEMPLARY EMBODIMENT

Figure 1:
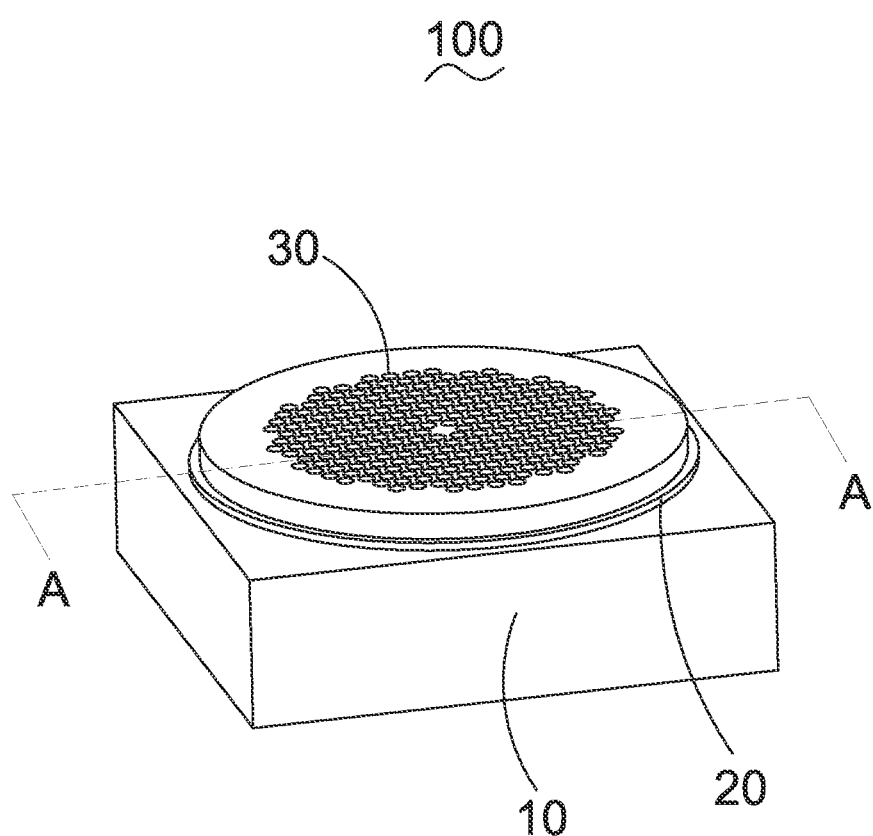
FIG. 1 is an isometric view of a MEMS chip in accordance with an exemplary embodiment of the present invention.
Figure 2:
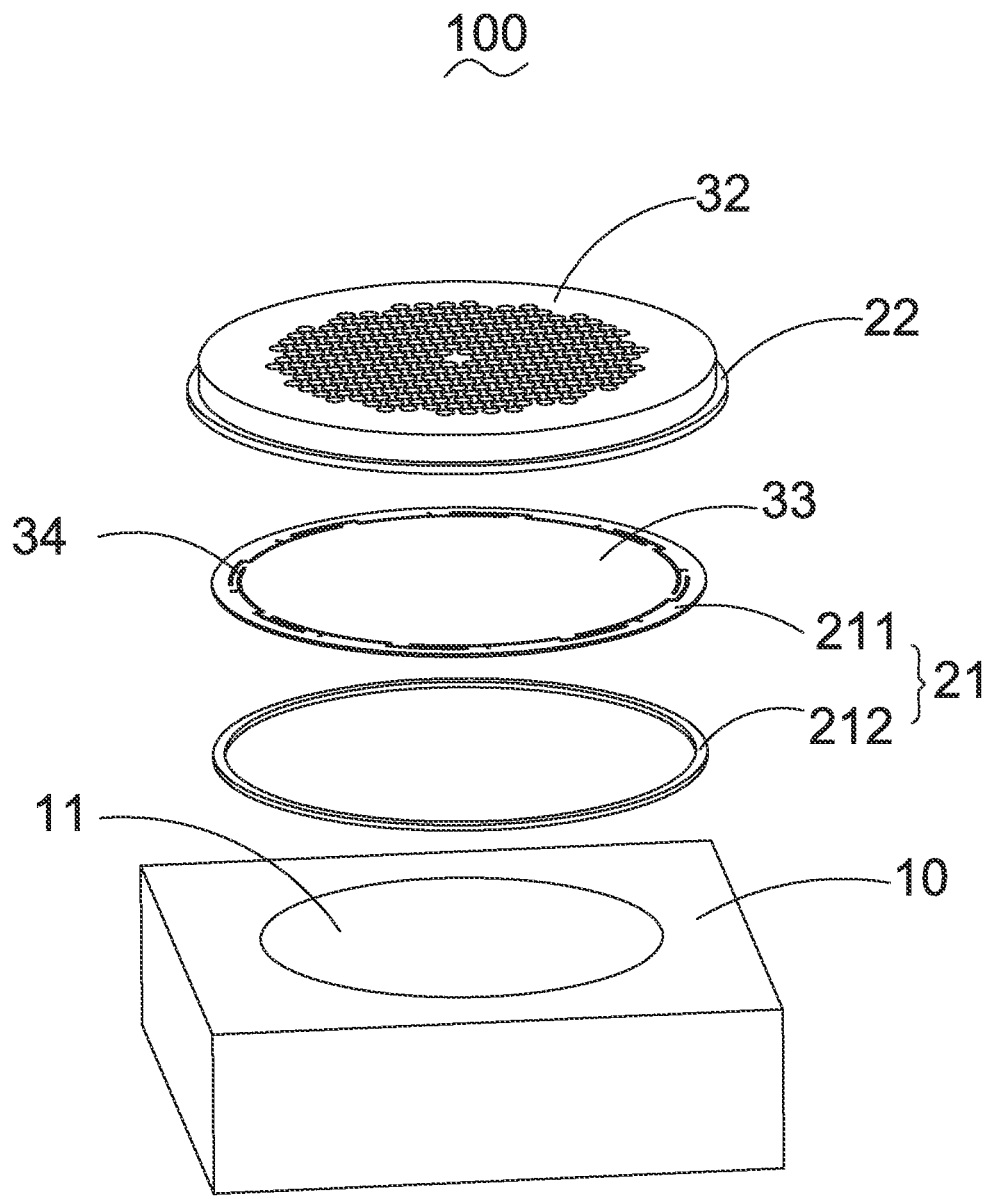
FIG. 2 is an isometric and exploded view of the MEMS chip in FIG. 1.
Figure 3:
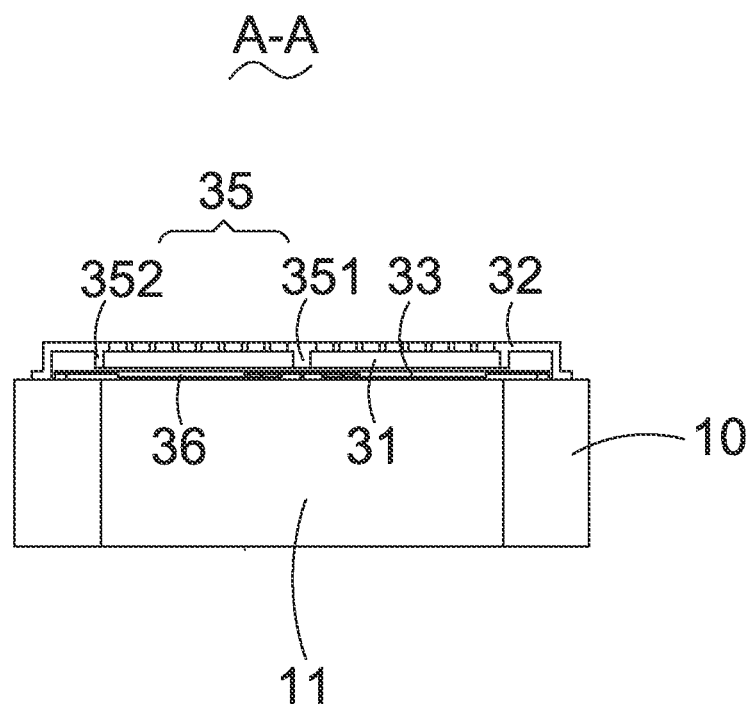
FIG. 3 is a cross-sectional view of the MEMS chip taken along line A-A in FIG. 1.

The present invention will hereinafter be described in detail with reference to an exemplary embodiment. To make the technical problems to be solved, technical solutions and beneficial effects of the present invention more apparent, the present invention is described in further detail together with the figure and the embodiment. It should be understood the specific embodiment described hereby is only to explain the disclosure, not intended to limit the disclosure.

It should be noted that the description of "first", "second" and the like in the present invention is only used for description purposes, and cannot be understood as indicating or implying its relative importance or implying the number of indicated technical features. Thus, a feature defined as "first" or "second" may include at least one such feature, either explicitly or implicitly. In addition, the technical solutions among the various embodiments can be combined with each other, but it must be based on that it can be realized by ordinary technicians. When the combination of the technical solutions is contradictory or cannot be realized, it should be considered that the combination of the technical solutions does not exist, nor is it within the scope of protection required by the present invention.

Please refer to FIGS. 1-5 together, a MEMS chip 100 provided by an exemplary embodiment of the present invention includes a substrate 10 with a back cavity 11, a support system 20 fixed on the substrate 10, and a capacitance system 30 disposed on the substrate 10. The support system 20 is configured to support the capacitance system 30 on the back cavity 11.

Specifically, the capacitance system 30 includes a back plate 32 and a membrane 33 opposite to the back plate 32. The back plate 32 and the membrane 33 are arranged at an interval to form an inner cavity 31, which provides vibration space for the membrane 33. The capacitance value of the capacitance system 30 varies with the distance between the back plate 32 and the membrane 33 when the membrane 33 vibrates under acoustic wave, therefore achieving acousto-electric conversion.

The support system 20 includes a first fixation portion 21 suspending the membrane 33 on the substrate 10, and a second fixation portion 22 suspending the back plate 32 on the substrate 10. In this embodiment, the first fixation portion 21 is in an annular shape. The membrane 33 is located inside the first fixation portion 21. Moreover, the membrane 33 includes a central portion 331 and an edge portion 332 surrounding the central portion 331. The capacitance system 30 further includes a plurality of elastic arms 34 connecting the edge portion 332 of the membrane 33 and the first fixation portion 21. The elastic arms 34 are arranged spaced apart from each other, surrounding the membrane 33 in a circumferential manner. Therefore, the edge portion 332 of the membrane 33 is partially fixed on the substrate 10, thus allowing the internal stress relief during vibration, reducing the stiffness of the membrane 33 and improving the sensitivity of the MEMS chip 100. It can be understood that one end of the elastic arm 34 is fixed on a periphery of the edge portion 332 and the other end of the elastic arm 34 is fixed on the first fixation portion 21.

Figure 4:
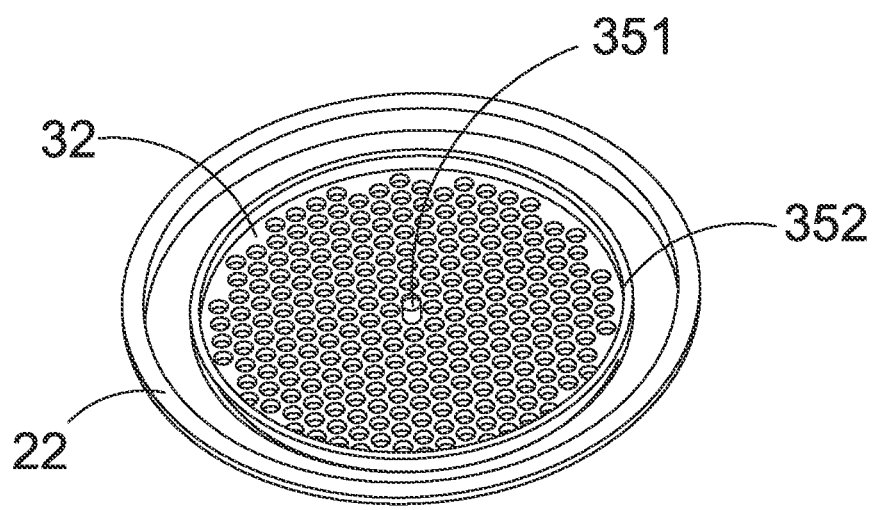
FIG. 4 is an isometric view of an assembly of a back plate, a protruding portion and a second fixation portion of the MEMS chip in FIG. 1.
Figure 5:
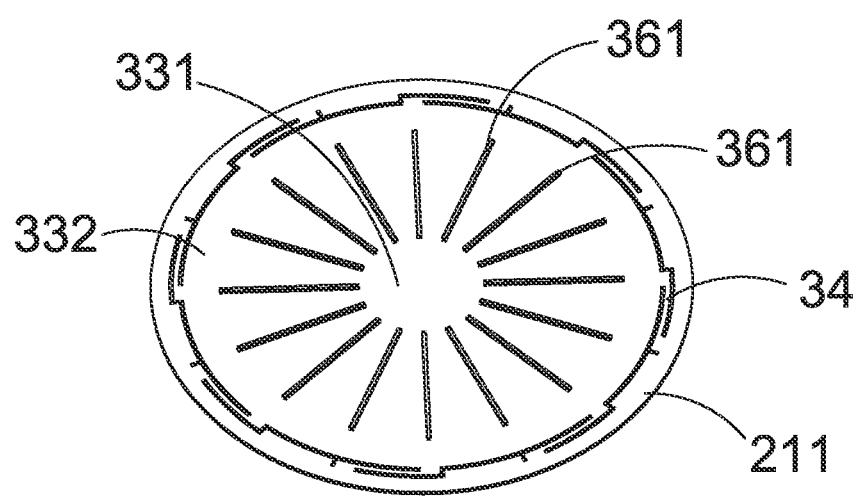
FIG. 5 is an isometric view of an assembly of a membrane, a plurality of elastic arms, a reinforce portion and a first fixation portion of the MEMS chip in FIG. 1.

In this embodiment, as shown in FIGS. 4-5, the back plate 32 is located on one side of the membrane 33 away from the back cavity 11. Furthermore, the capacitance system 30 includes a protruding portion 35 and a reinforce portion 36. More specifically, the protruding portion 35 is fixed on the back plate 32 and accommodated in the inner cavity 31. The protruding portion 35 is spaced apart from the membrane 33 along a vibration direction of the membrane 33. It can be understood that the protruding portion 35 extends from one surface of the back plate 32 facing the membrane 33 towards the membrane 33. In another word, along the vibration direction, a length of the protruding portion 35 is smaller than a distance between the back plate 32 and the membrane 33.

In related art, the stiffness of the membrane would be adjusted by increasing its thickness, but it may increase the weight of the membrane which may reduce the resonance frequency of the MEMS chip. Therefore, in this embodiment, the reinforce portion 36 is provided on the membrane 33 to adjust the stiffness of the membrane 33. Furthermore, an area of the reinforce portion 36 is smaller than an area of the membrane 33, thus maintaining the resonance frequency of the MEMS chip 100. Further, the reinforce portion 36 is located on one side of the membrane 33 away from the inner cavity 31. A projection of the reinforce portion 36 is located in the back cavity 11.

Moreover, the reinforce portion 36 includes a plurality of reinforce ribs 361 in a strip shape; the reinforce ribs 361 are arranged at intervals. As shown in FIG. 5, the membrane 33 is in a circle shape; the reinforce rib 361 extends along a radial direction of the membrane 33; the reinforce ribs 361 are arranged as a ring around a center of the membrane 33. In other words, a center of the reinforce portion 36 is just the center of the membrane 33. In this manner, the stiffness of the membrane 33 could be adjusted by adjusting the shape and arrangement of the reinforce ribs 361. In the same time, the resonance frequency of the MEMS chip 100 could be optimized.

Moreover, the protruding portion 35 includes a first protrusion 351 located in a central position, and a second protrusion 352 surrounding the first protrusion 351. Along the vibration direction, the first protrusion 351 is located corresponding to the center of the membrane 33. That is, a projection of the first protrusion 351 is located inside of the reinforce ribs 361. In this embodiment, the first protrusion 351 is in a cylinder shape, and the second protrusion 352 is in an annular shape. It is clearly shown that the first protrusion 351 is located inside the second protrusion 352. The first protrusion 351 and the second protrusion 352 are spaced from each other. Therefore, the stiffness of the membrane 33 could be adjusted by changing the diameter of the second protrusion 352, effectively improving the sensitivity of the MEMS chip 100.

Compared with the related art, in the embodiment of the present invention, the MEMS chip includes a substrate, a membrane suspended by a first fixation portion, and a back plate suspended by the second fixation portion. The membrane is fixed to the first fixation portion via a plurality of adjacent elastic arms. In this manner, the membrane could release the internal stress via vibration, thus reducing the stiffness of the membrane and improving the sensitivity of the MEMS chip. The MEMS chip further includes a first protrusion and an annular second protrusion fixed on the back plate, effectively improving the low frequency property of the MEMS chip. A reinforce portion composed of a plurality of reinforce ribs is provided on the membrane. The stiffness of the membrane could be adjusted by adjusting the diameter of the second protrusion and the shape and the arrangement of the reinforce ribs, and the resonance frequency of the MEMS chip could be accordingly increased.

It is to be understood, however, that even though numerous characteristics and advantages of the present exemplary embodiments have been set forth in the foregoing description, together with details of the structures and functions of the embodiments, the disclosure is illustrative only, and changes may be made in detail, especially in matters of shape, size, and arrangement of parts within the principles of the invention to the full extent indicated by the broad general meaning of the terms where the appended claims are expressed.

What is claimed is:

1. A Micro-Electro-Mechanical System (MEMS) chip comprising:
   a substrate with a back cavity;
   a capacitance system disposed on the substrate, comprising:
      a back plate;
      a membrane in a circle shape opposite to the back plate forming an inner cavity;
      a protruding portion accommodated in the inner cavity, fixed on one of the back plate and the membrane and spaced apart from the other along a vibration direction; and
      a reinforce portion fixed to the membrane, having an area smaller than that of the membrane;
   a support system configured to support the capacitance system, comprising:
      a first fixation portion suspending the membrane on the substrate; and
      a second fixation portion suspending the back plate on the substrate; wherein
   the reinforce portion comprises a plurality of reinforce ribs in a strip shape; the reinforce rib extends along a radial direction of the membrane; the reinforce ribs are arranged as a ring around a center of the membrane;
   the protruding portion comprises a first protrusion located in a central position and a second protrusion surrounding the first protrusion;

a projection of the first protrusion along the vibration direction located inside an area enclosed by an inner end of each reinforce rib;

a projection of the reinforce portion along the vibration direction is located inside the second protrusion.

2. The MEMS chip as described in claim 1, wherein a projection of the reinforce portion along the vibration direction is located in the back cavity.

3. The MEMS chip as described in claim 2, wherein the reinforce portion is fixed to one side of the membrane away from the inner cavity.

4. The MEMS chip as described in claim 1, wherein along the vibration direction, the first protrusion is located corresponding to the center of the membrane.

5. The MEMS chip as described in claim 4, wherein the first protrusion is in a cylinder shape.

6. The MEMS chip as described in claim 4, wherein the second protrusion is in an annular shape.

7. The MEMS chip as described in claim 4, wherein the protruding portion extends from a side of the back plate facing the membrane towards the membrane.

8. The MEMS chip as described in claim 1, wherein the capacitance system further comprises a plurality of elastic arms connecting a periphery of the membrane to the first fixation portion.

* * * * *